(12) United States Patent
Nakaoka

(10) Patent No.: US 6,349,064 B1
(45) Date of Patent: Feb. 19, 2002

(54) SEMICONDUCTOR MEMORY DEVICE CAPABLE OF INDEPENDENT SELECTION OF NORMAL AND REDUNDANT MEMORY CELLS AFTER PROGRAMMING OF REDUNDANT ADDRESS

(75) Inventor: Yoshito Nakaoka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/760,642

(22) Filed: Jan. 17, 2001

(30) Foreign Application Priority Data

Aug. 10, 2000 (JP) ............................................ 12-242649

(51) Int. Cl.$^7$ .................................................. G11C 7/00
(52) U.S. Cl. ................ 365/200; 365/230.08; 365/225.7
(58) Field of Search ........................... 365/200, 230.01, 365/230.08, 241, 225.7

(56) References Cited

U.S. PATENT DOCUMENTS 5,748,543 A * 5/1998 Lee et al. .................... 365/200

6,178,126 B1 * 1/2001 Kirihata et al. ............. 365/200

FOREIGN PATENT DOCUMENTS

JP 11-144494 5/1999

* cited by examiner

Primary Examiner—David Nelms
Assistant Examiner—Thong Le
(74) Attorney, Agent, or Firm—McDermott, Will & Emery

(57) ABSTRACT

A redundancy determining unit pre-stores a defective memory cell address in a normal memory cell array, and selects a redundant memory cell instead of a normal memory cell in a normal operational mode. The redundancy determining unit selects a designated redundant memory cell row in response to an address signal when a test mode signal and a redundancy identification address signal are activated. If the test mode signal is activated whereas the redundancy identification address signal is inactivated, a replacement operation for the normal memory cell and the redundant memory cell is stopped.

12 Claims, 11 Drawing Sheets

SEMICONDUCTOR MEMORY DEVICE CAPABLE OF INDEPENDENT SELECTION OF NORMAL AND REDUNDANT MEMORY CELLS AFTER PROGRAMMING OF REDUNDANT ADDRESS

BACKGROUND OF THE INVENTION

1. Field of the Invention

The present invention relates to a configuration of a semiconductor memory device having a redundancy function.

2. Description of the Background Art

A conventional semiconductor memory device is generally pre-provided with a redundant portion in a memory cell array in order to compensate yield reduction due to occurrence of a defection in a memory cell included in the memory cell array.

FIG. 11 schematically illustrates a configuration of such a conventional memory cell array.

Referring to FIG. 11, memory cell array 100 includes a normal memory cell array portion 100n and a redundant memory cell array portion 100R.

Redundant memory cell array portion 100R includes a redundant memory cell row portion 100RR, a redundant memory cell column portion 100RC, and a redundant part of the redundant portions 100RRC.

The memory cell space of normal memory cell array portion 100n is tested during a manufacturing process of the semiconductor memory device to detect a defective memory cell. The detected defective memory cell is replaced by a memory cell in redundant memory cell array portion 100R.

A method for performing such replacement generally includes programming of a defective address corresponding to the defective memory cell using a fuse circuit. The programming of such a defective address is performed by blowing off a fuse using electricity, laser or the like.

Further, a defective memory cell may exist in the memory space for redundant memory cell array portion 100R. Therefore, the test for the memory cell space during the manufacturing process, as described above, also needs to perform a test for redundant memory cell array portion 100R.

FIG. 12 is a schematic block diagram for illustrating the configuration of memory cell array 100 shown in FIG. 11 in more detail.

Referring to FIG. 12, normal memory cell array portion 100n is provided with word lines WL0 to WL15 corresponding to the memory cell rows thereof, whereas redundant memory cell row portion 1OORR is provided with spare word lines SWL0 to SWL3 corresponding to the memory cell rows thereof. Word lines WL0 to WL15 are selectively activated by a row decoder 110 decoding a row address signal.

A spare row decoder 112' provided corresponding to spare word lines SWL0 to SWL3 performs non-volatile storage of a defective row address which includes a defective memory cell by a fuse element or the like, and when the defective row address is accessed, activates one of spare word lines SWL0 to SWL3, for example, spare word line SWL2, instead of a word line WLn corresponding to the defective row address.

Further, bit line pairs BL0 and /BL0 to BL15 and /BL15 are provided in common to normal memory cell array portion 100n and redundant memory cell row portion 100RR, corresponding to the memory cell rows thereof.

Spare bit line pairs SBL0 and /SBL0 to SBL3 and /SBL3 are provided in redundant memory cell column portion 100RC, corresponding to the memory cell columns thereof. A memory cell MC is provided corresponding to each crossing point of bit line pairs BL0, /BL0 to BL15, /BL15 and spare bit lines SBL0, /SBL0 to SBL3, /SBL3, and word lines WL0 to WL15 and spare word lines SWL0 to SWL3.

Column decoder 120 decodes a column address signal, and selectively activates a sense amplifier and I/O circuit (hereinafter referred to as SA+I/O circuit) 140 for a selected memory cell column, to selectively transmit data read onto a bit line pair corresponding to the selected memory cell column to IO line pairs IO and /IO.

It is noted, in FIG. 12, that SA+I/O circuit 140 includes a differential amplifier for amplifying a potential difference of a bit line pair and a gate circuit for selectively connecting the selected bit line pair and IO line pair IO, /IO.

Spare column decoder 122' stores a defective column address including a defective memory cell, by a fuse element or the like, and when the defective column address is accessed, selectively connects one of the spare bit line pairs, for example, spare bit line pair SBL0 and /SBL0, to IO line pair IO and /IO, instead of a bit line pair corresponding to the defective column address, for example, a bit line pair BL12 and /BL12.

A testing operation for detecting a defective memory cell for the semiconductor memory device having memory cell array 100 as shown in FIG. 12 will now be described.

The test for the memory cell space constituted by the conventional memory cell array 100 as shown in FIG. 12 includes a plurality of types of tests as described below.

(1) The test before a replacement process by a redundant portion includes the following:
   (1-1) A test for normal memory cell array portion 100n in the memory cell space;
   (1-2) A test for redundant memory cell array portion 100R in the memory cell space.

(2) The test after the replacement process by the redundant portion includes the following:
   (2-1) A test for a normal portion (including an address replaced by the redundant portion) in the memory cell space.

Referring to FIG. 12, the test for the normal memory cell array portion in the memory cell space described above performed before the replacement process by the redundant portion (1-1) includes a test for the memory cell space corresponding to word lines WL0 to WL15 and bit line pairs BL0, /BL to BL15, /BL15.

The test for the redundant memory cell array portion in the memory cell space performed before the replacement process by the redundant portion (1-2) includes tests for three portions as described below.

i) A test for the memory cell space constituted by spare word lines SWL0 to SWL3 and bit line pairs BL0, /BL0 to BL15, /BL15;

ii) A test for the memory cell space constituted by word lines WL0 to WL15 and spare bit line pairs SBL0, /SBL0 to SBL3, /SBL3; and iii) A test for the memory, cell space constituted by spare word lines SWL0 to SWL3, and spare bit line pairs SBL0, /SBL0 to SBL3, /SBL3.

If redundant memory cell array portions 100RR and 100RC include a defective bit as a result of such tests for the redundancy memory cell array portions, a repair is performed by replacing the defective portion with redundant part of the redundant portions 100RRC. In such a case, it is unnecessary to completely repair redundant portions 100RR and 100RC, and it would be sufficient if there are replaceable spare rows or columns of at least a number required for repairing the defective bit of the normal memory cell array portion.

Further, in the test performed after the replacement process by the redundant memory cell array portion (2-1) when, for example, word line WLn is replaced by a spare word line SWL2, a test for the memory cell space constitute by word lines W10 to WLn−1, SWL2, WLn+1 to WL15, and bit line pairs BL0, /BL0 to BL15,/BL15 will be performed.

In the memory cell space, the boundaries of the normal memory cell array portion and the redundant memory cell array portion are physically adjacent to each other. Thus, the configurations thereof are basically the same, except for what is used for driving the portions, row decoder 110 and column decoder 120 or redundant row decoder 112' and redundant column decoder 122'.

In other words, they are different in the respect that an address provided upon access of the memory cell array is allocated to normal memory cell array portion 100n, whereas no address is allocated to redundant memory cell array portion 100R since this portion is for replacing a memory cell row or a memory cell column in normal memory cell array portion 100n.

If, for example, word line WLn is replaced with spare word line SWL2 as described above, a defective memory cell existing in a memory cell row corresponding to word line WLn will be repaired.

However, malfunction of a defective memory cell MCf1 corresponding to word line WLn is sometimes caused by an interference (e.g., weak leakage) or the like between the defective memory cell MCf1 and memory cell MCf2 adjacent to defective memory cell MCf1 and corresponding to the neighboring word line WLn−1. In such a case, defective memory cell MCf1 can be repaired by replacing word line WLn with spare word line SWL2.

However, in a subsequent acceleration test, word line WLn will not be selected during the acceleration test inspite of the fact that no replacement was made to word line WLn−1 including memory cell MCf2 having the interference with defective memory cell MCf1. Thus, it will be difficult to accelerate and elicit the influence of the interference existing between such memory cells (MCf1, MCf2).

In other words, because of the replacement made by the redundant memory cell row, the defection to be elicited may possibly remain concealed in the subsequent acceleration test.

A case where a memory to be replaced is adjacent to a defective memory cell may have a problem similar to the one described above.

Further, even when no redundant memory cell array portion is used, if a defective memory cell exists in redundant memory cell array portion 100R adjacent to normal memory cell array portion 100n, the redundant memory cell array portion will not be selected as well by the acceleration test, and thus such defection may not be elicited by the acceleration test.

It is possible to improve the yield of a semiconductor memory device by providing redundant memory cell array portion 100R corresponding to normal memory cell array portion 100n as described above. However, nowadays, such simple yield improvement is insufficient, since a defective mode may be concealed, due to interference existing between memory cells or the like, as a device structure is being smaller in size.

In such a case, even if the defective memory cell is simply replaced by a redundant memory cell, it will rather be difficult to elicit a defection by the acceleration test.

Further, if such a defective mode difficult for the acceleration test were to be elicited, it would require an extended test time.

SUMMARY OF THE INVENTION

It is an object of the present invention to provide a semiconductor memory device enabling an elicitation of a concealed defective mode existing between memory cells by an acceleration test, even when a defective memory cell existing in a normal memory cell array portion is replaced by a memory cell in a redundant memory cell array portion.

According to one aspect of the present invention, a semiconductor memory device includes a memory cell array, an operational mode detecting circuit, an address signal input terminal group and a memory cell selecting circuit.

The memory cell array includes memory cells arranged in a plurality of rows and columns. The memory cell array includes a normal memory cell array in which a plurality of normal memory cells are arranged, and a redundant memory cell array in which a plurality of redundant memory cells are arranged for replacing the plurality of normal memory cells.

The operational mode detecting circuit detects that a predetermined operational mode is designated in response to an external instruction.

The address signal input terminal group receives an address signal for selecting a memory cell.

The memory cell selecting circuit independently and successively selects a plurality of normal memory cells and a plurality of redundant memory cells, in response to the address signal in the predetermined operational mode.

Therefore, a main advantage of the present invention is that the acceleration test can be performed for malfunction of the entire memory cell space including the redundant memory cell portion, independent of replacement of a defective memory cell with a redundant memory cell, since the normal memory cell array portion and the redundant memory cell array portion are separated in the memory cell space such that an arbitrary memory cell can be externally selected. This allows testing of the defective memory cell to easily be implemented with high power of detection.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
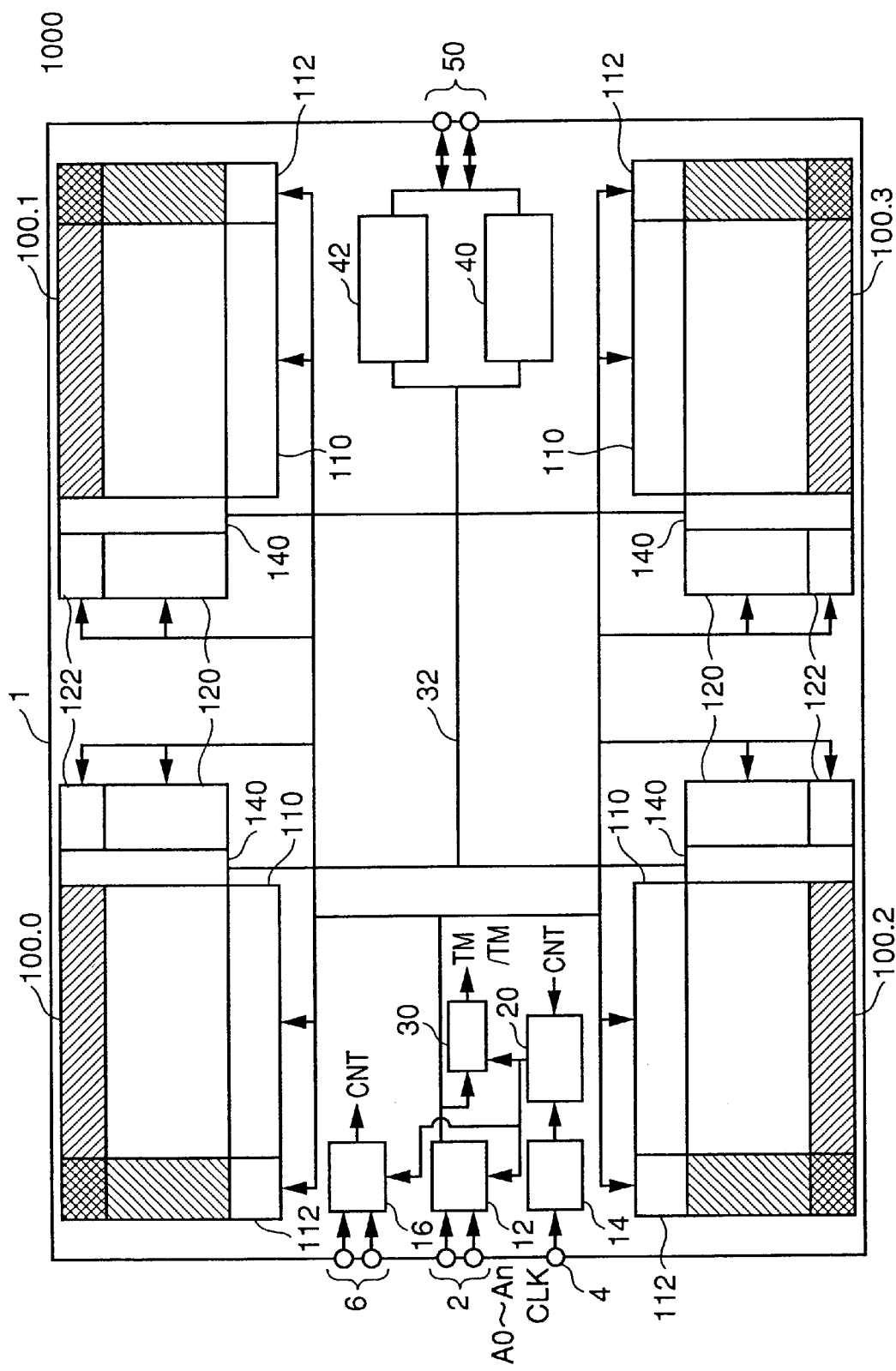
FIG. 1 is a schematic block diagram illustrating a configuration of a semiconductor memory device 1000 of the present invention.

FIG. 1 is a schematic block diagram illustrating a configuration of a semiconductor memory device 1000 of the present invention.

Though semiconductor memory device 1000 will be described as a dynamic random access memory device (hereinafter referred to as DRAM) mounted on one chip in the description below, the present invention will not be limited thereto, but rather can be applied to another semiconductor memory device in which a redundant memory cell is provided, or in which a semiconductor memory circuit is mounted together with a logic circuit on one chip.

Referring to FIG. 1, semiconductor memory device 1000 includes memory cell arrays 100.0 to 100.3, each having a plurality of memory cells arranged in rows and columns, on a semiconductor chip 1.

Semiconductor memory device 1000 also includes a normal row decoder 110, a spare row decoder 112, a normal column decoder 120 and a spare column decoder 122, respectively corresponding to memory cell arrays 100.0 to 100.3.

Semiconductor memory device 1000 further includes an address input terminal group 2 for inputting address signals A0 to An, a clock signal input terminal 4 for inputting a clock signal CLK, an output signal input terminal group 6 receiving external control signals such as a row address strobe signal RAS, a column address strobe signal CAS, a write enable signal WE and an output enable signal OE.

Semiconductor memory device 1000 further includes an address buffer 12 for buffering an address signal applied from address signal input terminal group 2 to generate an input address signal, a clock buffer 14 for receiving clock signal CLK from clock signal input terminal 4 for buffering, a control signal input buffer 16 for receiving an external control signal for buffering, a clock generating circuit 20 for receiving an output of clock buffer 14 and an output CNT from control signal input buffer 16 to generate an internal control signal for controlling an operation of semiconductor memory device 1000, and a test mode signal generating circuit 30 operating in response to the internal control signal from clock generating circuit 20 to generate test mode signals TM and /TM in accordance with a combination of the internal address signal from address buffer 12 and the external control signal.

Row decoder 110 and spare row decoder 112 select a corresponding memory cell row in response to the internal address signal from address buffer 12, whereas column decoder 120 and spare column decoder 122 select a corresponding memory cell column in response to the internal address signal from address buffer 12.

Each of memory cell arrays 100.0 to 100.3 is provided with an SA+IO circuit 140 for amplifying read data from the selected memory cell to output the data to an IO bus 32.

The data read from IO bus 32 is output to a data input/output terminal group 50 via a data output buffer 40.

On the other hand, when the data is written, write data applied to data input/output terminal group 50 is then applied to IO bus 32 via an input buffer 42, and is further transmitted from IO bus 32 to the selected memory cell via SA+IO circuit 140.

(Configuration Enabling Selection of Redundant Memory Cell)

Before describing the configuration of the redundant circuit of the present invention, a configuration required to enable the selection of the redundant memory cell in a test operational mode before redundancy replacement as described earlier is now described.

Figure 2:
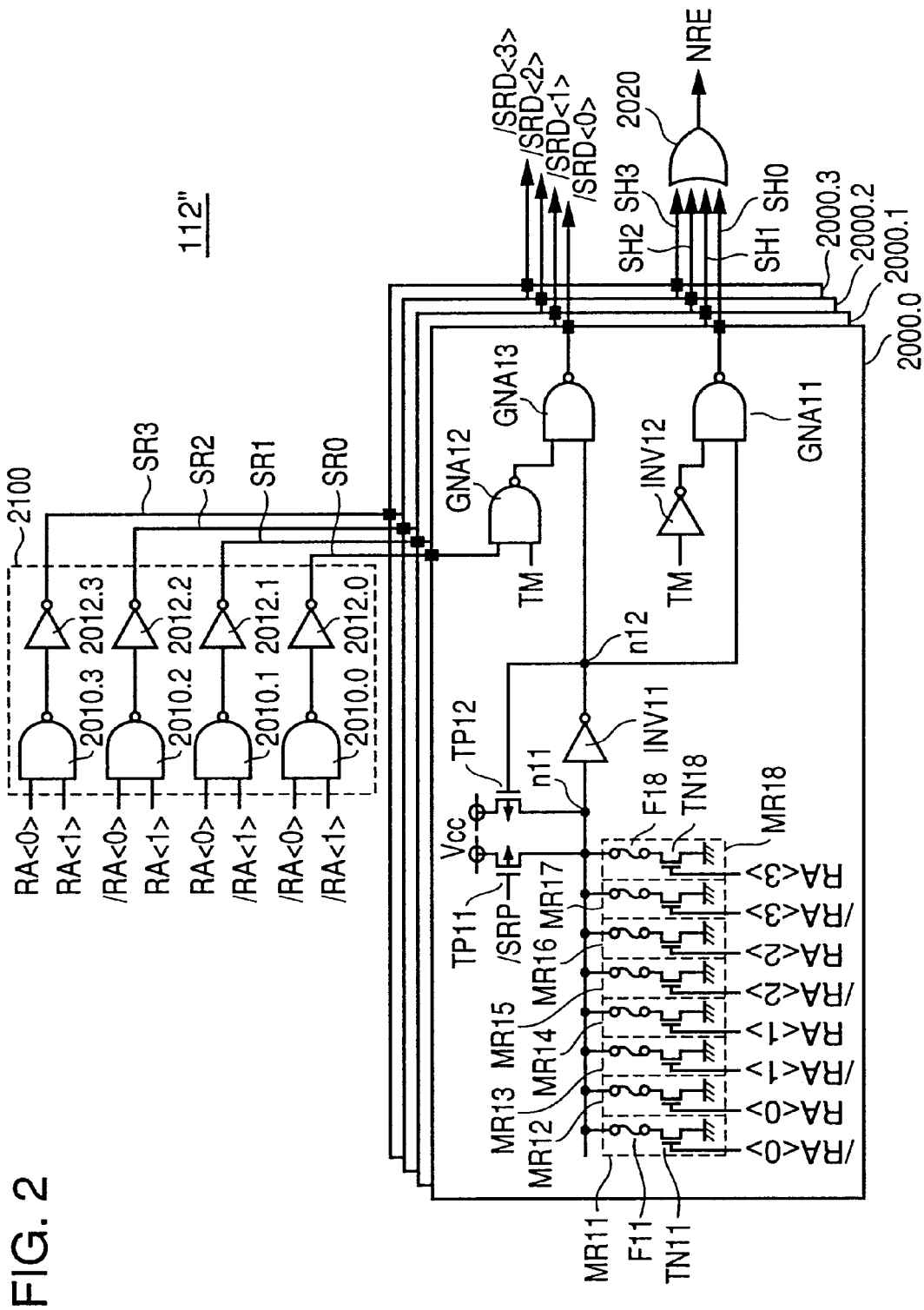
FIG. 2 is a schematic block diagram for illustrating a configuration of a spare row decoder 112"

FIG. 2 is a schematic block diagram for illustrating a configuration of a spare row decoder 112" selecting such a redundant memory cell.

Referring to FIG. 2, spare row decoder 112" includes redundancy determining units 2000.0 to 2000.3 provided respectively corresponding to spare word lines SWL0 to SWL3. Spare word lines SWL0 to SWL3 are initially set to a state where any of them can be selected (activated state). In such an initial state, if the stored defective address and the memory cell address to be selected are inconsistent in the normal operational state, redundancy determining units 2000.0 to 2000.3 respectively inactivate control signals /SRD<0> to /SRD<3> for a word line driver in order to inactivate corresponding spare word lines SWL0 to SWL3. On the other hand, if the stored defective address and the memory cell address to be selected are consistent with each other in the normal operational state in one of redundancy determining units 2000.0 to 2000.3, the redundancy determining unit maintains a corresponding one of control signals /SRD<0> to /SRD<3> to be active.

Spare row decoder 112" further includes, in the test mode (signal TM is at a logic high or "H" level), a spare word line selective signal generating circuit 2100 to generate signals SR0 to SR3 for respectively selecting spare word lines SWL0 to SWL3 to apply the signals to redundancy determining units 2000.0 to 2000.3.

Spare word line selective signal generating circuit 2100 includes an NAND circuit 2010.0 receiving internal row address signals /RA<0> and /RA<1> generated based on a row address signal; an inverter 2012.0 receiving an output of NAND circuit 2010.0 to output a control signal SR0 for redundancy determining unit 2000.0; an NAND circuit 2010.1 receiving an internal row address signal RA<0> which is an inversion signal of internal row address signal /RA<0> and internal row address signal /RA <1>; an inverter 2012.1 receiving an output of NAND circuit 2010.1 to output a control signal SR1 for redundancy determining unit 2000.1; an NAND circuit 2010.2 receiving internal address signal RA<1> which is an inversion signal of internal row address signal /RA<1> and internal row address signal /RA<0>; an inverter 2012.2 receiving an output of NAND circuit 2010.2 to output a control signal SR2 for redundancy determining unit 2000.2; an NAND circuit 2010.3 receiving internal row address signal RA<0> and RA<1>; and an inverter 2012.3 for receiving an output of NAND circuit 2010.3 to output a control signal SR3 for redundancy determining unit 2000.3.

Spare row decoder 112" further includes an NOR circuit 2020 for receiving signals SH0 to SH3 output from redundancy determining units 2000.0 to 2000.3 to output a signal NRE for instructing an activation of decoder operation for normal row decoder 110.

Redundancy determining unit 2000.0 includes a P-channel MOS transistor TP11 provided between a node n11 and a power-supply potential Vcc to be conducted in response to a signal /SRP for pre-charging node n11, and programming elements MR11 to MR18 provided in parallel between node n11 and a ground potential GND.

Programming element MR11 includes a fuse element F11 and an N-channel MOS transistor TN11 provided in series between node n11 and ground potential GND. The gate of transistor TN11 receives internal address signal /RA<0>.

Configurations of the other programming elements MR12 to MR18 are basically similar to that of programming element MR11, except for internal address signals to be input. Here, programming elements MR12 to MR18 respectively receive internal address signals RA<0>, /RA<1>, RA<1>, /RA<2>, RA<2>, /RA<3> and RA<3>.

Redundancy determining unit 2000.0 further includes a P-channel MOS transistor TP12 provided between node n 11 and power-supply potential Vcc, and an inverter INV11 provided between node n11 and a node n12. Node n11 is connected to the gate of transistor TP12, and thus transistor TP12 and inverter INV11 constitute a half latch circuit.

Redundancy determining unit 2000.0 further includes an inverter INV12 receiving test mode signal TM, an NAND circuit GNA11 receiving an output of inverter INV12 and a potential level of node n12 to output a signal SH0, an NAND circuit GNA12 receiving a signal SR0 and test mode signal TM, and an NAND circuit GNA13 receiving an output of NAND gate GNA12 and a potential of node n12 at the input thereof to output a signal /SRD<0>.

A word line driver circuit (not shown) driving a word line SWL0 is controlled in response to signal /SRD<0>.

The other redundancy determining units 2000.1 to 2000.3 basically have similar configurations.

Next, an operation of spare row decoder 112" shown in FIG. 2 is briefly described.

The defective address to be replaced is programmed by blowing off fuse elements F11 to F18 in programming elements MR11 to MR18.

When an address signal is consistent with the programmed defective address, one of the spare word lines, for example SWL0, is selected as described below.

i) Operation in Normal Operational Mode

Node n11 is pre-charged to "H" level since signal /SRP is at a logic low or "L" level. When an internal address signal corresponds to the programmed defective address, the potential level of node n11 is kept at "H" level, whereas the potential level of node n12 will be at "L" level.

When not operated in the test mode, signal TM is at "L" level, so that the output of NAND circuit GNA12 is at "H" level. Therefore, signal /SRD<0> will be activated ("H" level) in accordance with the potential level of node n12 being "L" level, and spare word line SWLO is selected. Here, the potential level of node n12 is at "L" level, whereas the output level of inverter INV12 is at "H" level, so that signal SH0 which is an output of NAND circuit GNA11 will be at "H" level. This makes signal NRE be at "L" level, and thus the operation of normal row decoder 110 is stopped.

When none of the four spare word lines SWL0 to SWL3 are used, signal NRE is at "H" level, and any one of the normal word lines WL0 to WL15 is selected by row decoder 110.

ii) Operation in Test Operational Mode

When a spare word line SWL is tested, test mode signal TM is made to be at "H" level. Accordingly, internal row address signals /RA<0> to /RA<1> and RA<0> to RA<1>can be used to select any one of spare word lines SWL0 to SWL3 in the test mode.

For example, if internal row address signal /RA<0> and /RA<1> are both at "H" level, an output of inverter 2012.0 will be at "H" level. Signal TM is at "H" level, so that an output of NAND circuit GNA12 will then be at "L" level. Thus, signal /SRD<0> from NAND circuit GNA13 will be at "H" level, independent of the level of node n12.

Further, when test mode signal TM is at "H" level, the output of inverter INV12 is at "L" level, and signals SH0 to SH3 output from NAND circuit GNA11 are all at "H" level, so that signal NRE will be at "L" level, and thus selecting operation of the normal word line will be stopped.

Therefore, such a configuration of spare row decoder 112" enables (1-1) the test of the normal memory cell array portion in the memory cell space before redundancy replacement, (1-2) the test of the redundant memory cell array portion in the memory cell space before redundancy replacement, and (2-1) the test of the normal memory cell array portion in the memory cell space after redundancy replacement.

However, the configuration shown in FIG. 2 alone is not sufficient in terms of the acceleration test for eliciting a concealed defection as described above.

(Configuration for Selecting Normal Memory Cell and Redundant Memory Cell After Programming)

Figure 3:
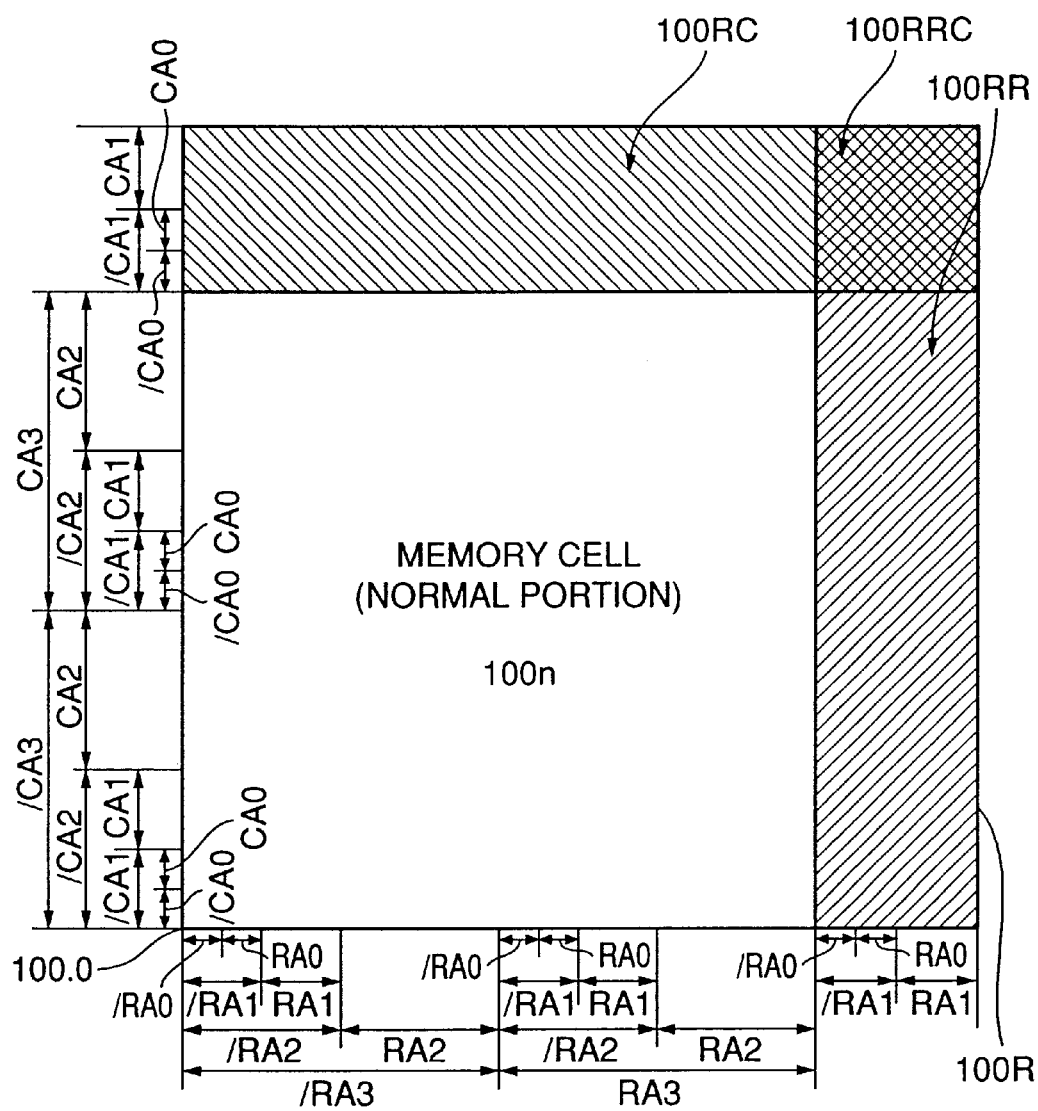
FIG. 3 schematically shows a configuration of address allocation in memory cell array 100.0 shown in FIG. 1.

FIG. 3 schematically shows a configuration of address allocation in memory cell array 100.0 shown in FIG. 1.

The other memory cell arrays 100.1 to 100.3 have similar configurations.

Memory cell array 100.0 includes a normal memory cell array portion 100n, a redundant memory cell row 100RR, a redundant memory cell column 100RC, and a redundant part of the redundant portions 100RRC.

For a row address of normal memory cell array portion 100n, a memory cell row is divided in two in response to an address signal RA3, and the memory cell row divided by address signal RA3 is further divided in two in response to a row address signal RA2.

The memory cell row divided by row address signal RA2 is further divided in two by a row address RA1, and the memory cell row divided by row address RA1 is further divided in two in response to a row address RA0.

Thus, 16 memory cell rows are identified in response to row address signals RA0 to RA3.

In a similar manner, 16 memory cell columns are identified in response to column address signals CA0 to CA3.

Further, 4 redundant rows are identified for the redundant row by signals RA1 and RA0, and 4 redundant memory cell columns are identified for the redundant column by column address signals CA0 and CA1.

It is noted that normal memory cell array 100n and redundant memory cell row 100RR are distinguished by signals RAr and /RAr, whereas normal memory cell array 100n and redundant memory cell row 100RC are distinguished by signals CAr and /CAr.

Figure 4:
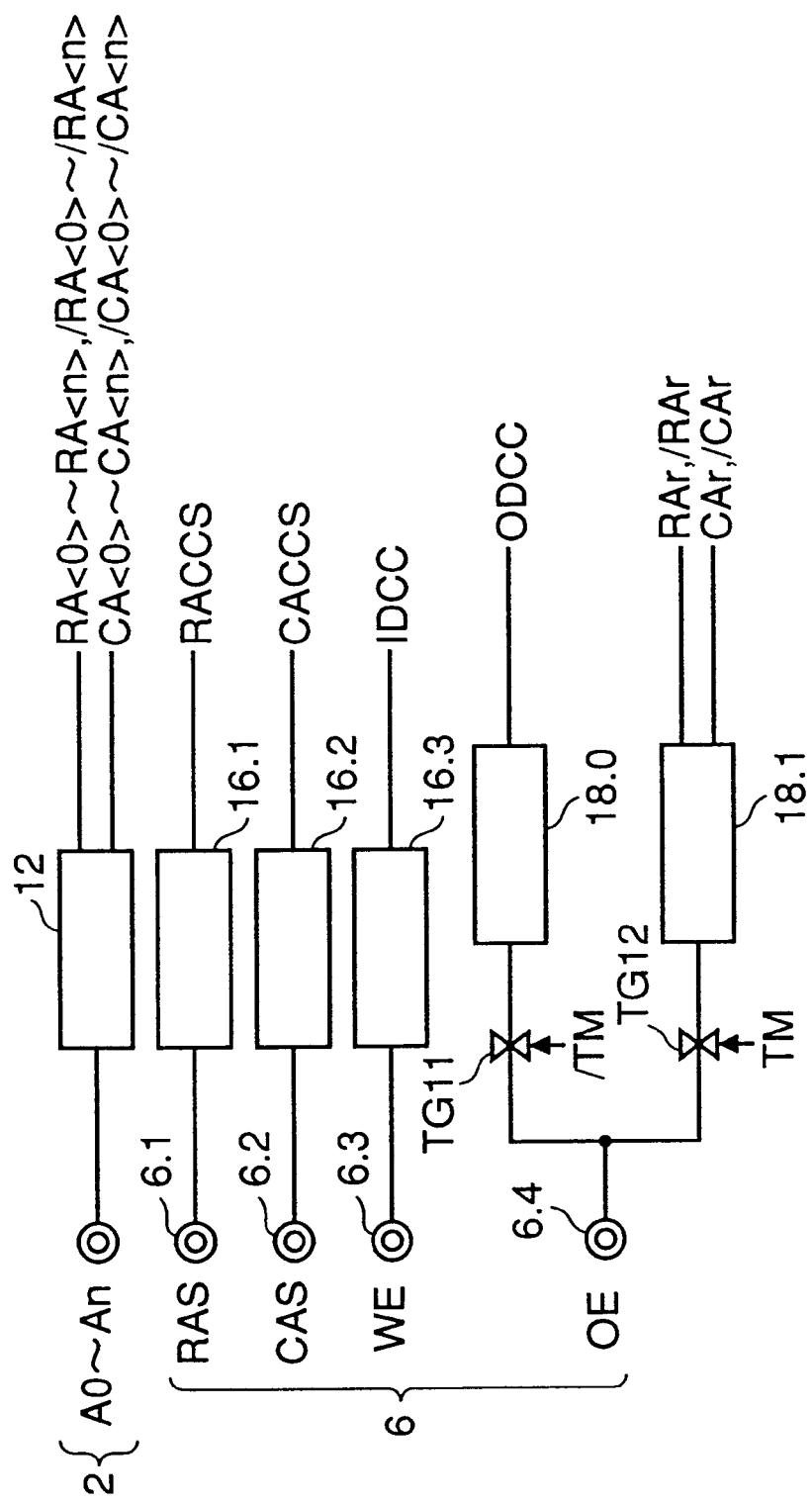
FIG. 4 is a schematic block diagram illustrating configurations of a control signal input terminal group 6 and an address signal input terminal group 2 shown in FIG. 1, and of a buffer circuit.

FIG. 4 is a schematic block diagram illustrating control signal input terminal group 6 and address signal input terminal group 2 shown in FIG. 1, and corresponding buffer circuits.

As described with reference to FIG. 1, signals applied to address signal input terminal group 2 are, converted into complementary signals of internal address signals RA<0> to RA<n>, and /RA<0> to /RA<n> (n=3 in the present embodiment). Similarly, column address signals are converted into complementary signals of internal address signals CA<0> to CA<n>, and /CA<0> to /CA<n>.

A row address strobe signal RAS applied to a control signal input terminal 6.1 is converted into a row address control clock signal RACCS by a buffer 16.1, whereas a column address strobe signal applied to a control signal input terminal 6.2 is converted into a column address control clock signal CACCS by a buffer circuit 16.2.

Further, a write enable signal WE applied to a control signal input terminal 6.3 is converted into an input data control signal IDCC by a buffer circuit 16.3.

In the normal operational mode, an output enable signal OE applied to a control signal input terminal 6.4 is applied to a buffer circuit 18.0 via a transfer gate TG11 controlled by an inversion signal /TM of the test mode signal, and is converted into an output data control clock signal ODCC.

In the test mode, on the other hand, an output enable signal OE applied to control signal input terminal 6.4 is applied to a buffer circuit 18.1 via a transfer gate TG12 controlled by test mode signal TM. Redundant address control signal RAr and redundant column address signal CAr, and signals /RAr and /CAr that are inversion signals thereof respectively are output from buffer circuit 18.1.

Figure 5:
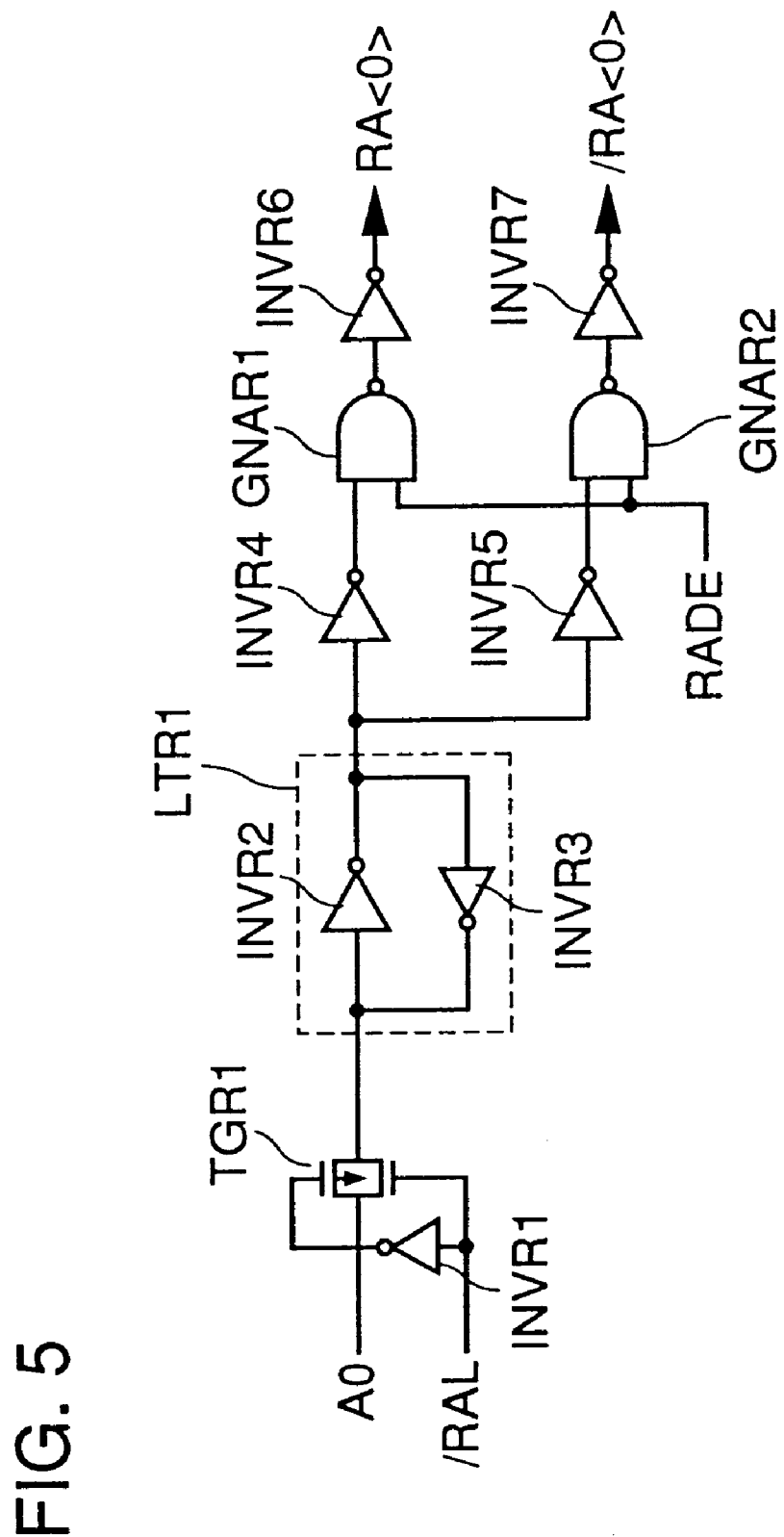
FIG. 5 is a circuit diagram illustrating a configuration of a partial circuit 12.R0 related to 1 bit signal A0 of a signal applied as a row address.

FIG. 5 is a circuit diagram illustrating a configuration of a partial circuit 12.R0 related to 1 bit signal A0 of a signal applied as a row address in address buffer 12 shown in FIG. 4.

Similar configurations can be provided corresponding to the other bits of the row address.

Referring to FIG. 5, partial circuit 12.R0 includes an inverter INVR1 receiving a signal /RAL output from a clock generating circuit 20, a transfer gate TGR1 controlled by an output of inverter INVR1 and signal /RAL for receiving address signal A0, and a latch circuit LTR1 for receiving an output of transfer gate TGR1 to latch the level of the output.

Latch circuit LTR1 includes an inverter INVR2 receiving the output of transfer gate TGR1, and an inverter INVR3 receiving an output of inverter INVR2 and inverting the output signal for applying it to an input node of inverter INVR2.

Partial circuit 12.R0 further includes inverters INVR4 and INVR5 receiving an output of inverter INVR4, and NAND circuit GNAR1 receiving a signal CADE from clock signal generating circuit 20 at one input node and an output of latch circuit LTR1 at the other input node, an NAND circuit GNAR2 receiving an output of inverter INVR5 at one input node and signal CADE at the other input node, an inverter iNVR6 receiving an output of NAND circuit GNAR1 to output an internal address signal RA<0>, and an inverter INVR7 receiving an output of NAND circuit GNAR2 to output an internal address signal [RA<0>] /RA<0>.

Figure 6:
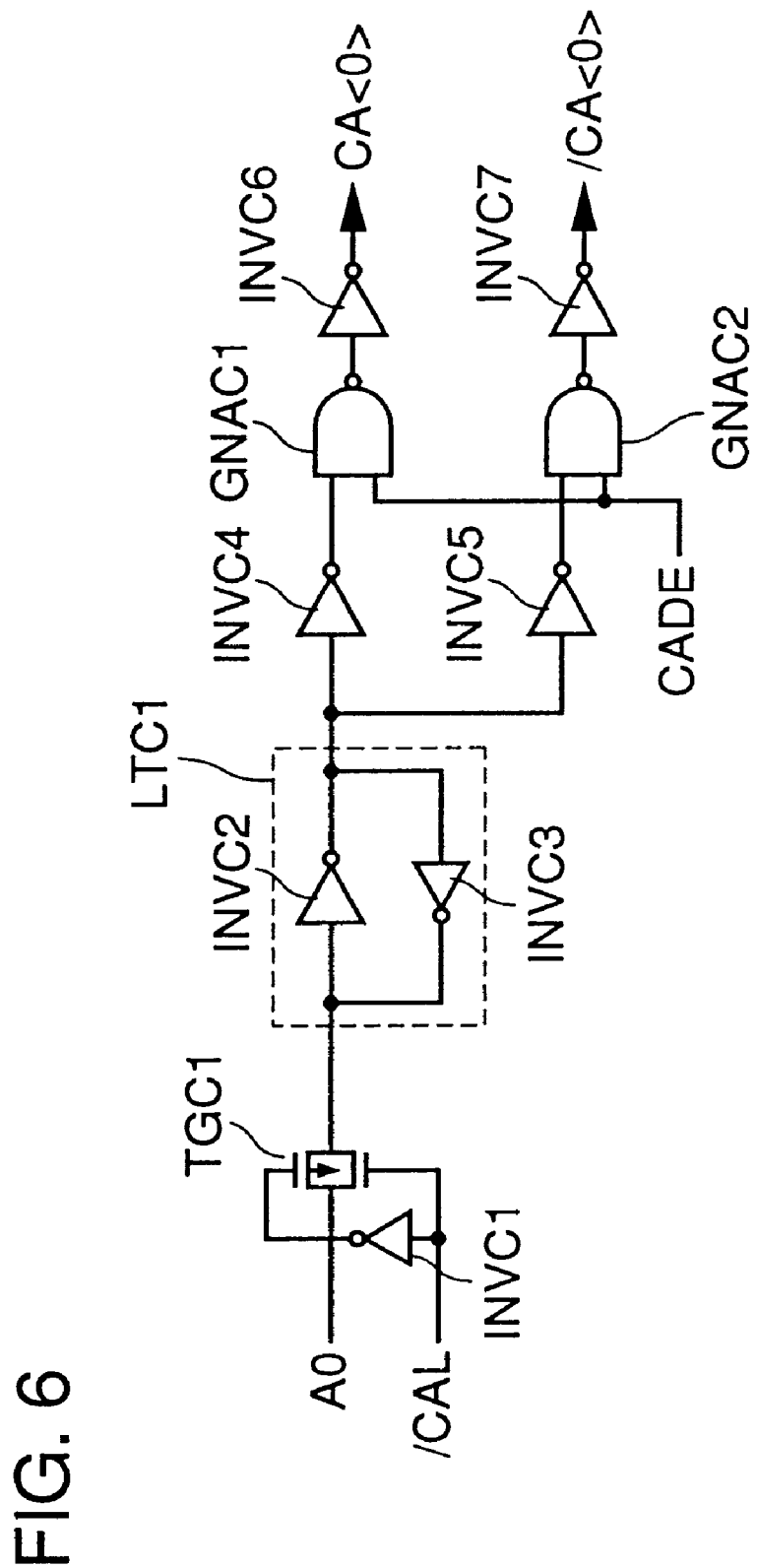
FIG. 6 is a circuit diagram illustrating a partial circuit 12.C0 corresponding to 1 bit of a column address included in an address buffer 12 shown in FIG. 4.

FIG. 6 is a circuit diagram illustrating a partial circuit 12.C0 corresponding to 1 bit of a column address included in address buffer 12 shown in FIG. 4.

Similar configurations are provided corresponding to the other bits of the column address.

Referring to FIG. 6, partial circuit 12.C0 includes an inverter INVC1 receiving a signal /CAL output from clock generating circuit 20, a transfer gate TGC1 controlled by an output of inverter INVC1 and signal /CAL to receive address signal AO, and a latch circuit LTC1 for receiving an output of transfer gate TGC1 to latch the level of the output.

Latch circuit LTC1 includes an inverter INVC2 receiving an output of transfer gate TGCl, and an inverter INVC3 receiving an output of inverter INVC2 and inverting the output signal for applying it to an input node of INVC2.

Partial circuit 12.C0 further includes inverts INVC4 and INVC5 receiving an output of latch circuit LTC1, and NAND circuit GNAC1 receiving a signal CADE from clock signal generating circuit 20 at one input node and an output of inverter INVC4 at the other input node, an NAND circuit GNAC2 receiving an output of invert INVC5 at one input node and signal CADE at the other input node, an inverter INVC6 receiving an output of NAND circuit GNAC1 to output an internal address signal CA<0>, and an inverter INVC7 for receiving an output of NAND circuit GNAC2 to output an internal address signal /CA<0>.

Circuits corresponding to partial circuits 12.R0 and 12.C0 is provided also in buffer circuit 18.1, and redundant address control signal RAr and redundant column address signal CAr, and signals /RAr and /CAr that are inversion signals thereof are generated.

Figure 7:
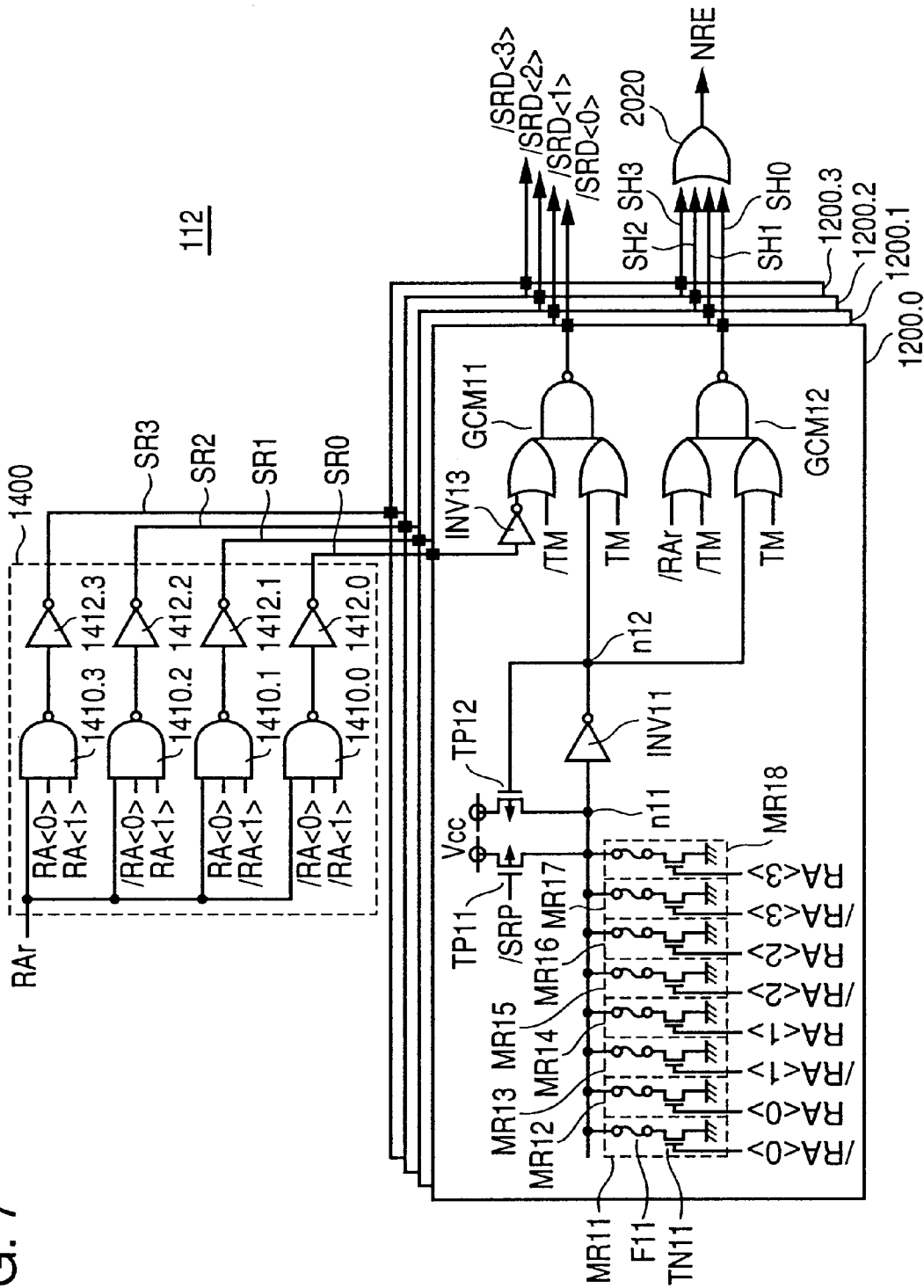
FIG. 7 is a schematic block diagram illustrating a configuration of a spare row decoder 112 shown in FIG. 1.

FIG. 7 is a schematic block diagram illustrating a configuration of spare row decoder 112 shown in FIG. 1.

Referring to FIG. 7, spare row decoder 112 includes redundancy determining units 1200.0 to 1200.3 provided respectively corresponding to spare word lines SWL0 to SWL3. Spare word lines SWL0 to SWL3 are initially set to a state where any of them can be selected (activated state). Under such an initial state, when the stored defective address is inconsistent with the memory cell address to be selected in the normal operation, redundancy determining units 1200.0 to 1200.3 respectively inactivate control signals /SRD<0> to /SRD<3> for a word line driver in order to inactivate corresponding spare word lines SWL0 to SWL3. On the other hand, if the stored defective address and the memory cell address to be selected are consistent with each other in a redundancy determining unit of redundancy determining units 1200.0 to 1200.3, the redundancy determining unit maintains a corresponding signal of control signals /SRD<0> to /SRD<3> to be active.

Spare row decoder 112 further includes a spare word line selective signal generating circuit 1400 for generating signals SR0 to SR3 for respectively selecting spare word lines SWL0 to SWL3 to apply the signals to redundancy determining units 1200.0 to 1200.3 in the test mode.

Spare word line selective signal generating circuit 1400 includes a 3-input NAND circuit 1410.0 receiving internal row address signals /RA<0> and /RA<1> and a signal RAr generated based on a row address signal; an inverter 1412.0 for receiving an output of 3-input NAND circuit 1410.0 to output a control signal SR0 for redundancy determining unit 1200.0; a 3-input NAND circuit 1410.1 receiving an internal address signal RA<0> which is an inversion signal of internal row address signal /RA<0>, an internal address signal /RA<1> and signal RAr; an inverter 1412.1 for receiving an output of 3-input NAND circuit 1410.1 to output a control signal SR1 for redundancy determining unit 1200.1; a 3-input NAND circuit 1410.2 receiving an internal address signal RA<1> which is an inversion signal of internal row address signal /RA<1>, an internal address signal /RA<0> and signal RAr, an inverter 1412.2 for receiving an output of 3-input NAND circuit 1410.2 to output a control signal SR2 for redundancy determining unit 1200.2; a 3-input NAND circuit 1410.3 for receiving internal row address signals RA<0> and RA<1> and signal RAr; and an inverter 1412.3 for receiving an output of 3-input NAND circuit 1410.3 to output a control signal SR3 for redundancy determining unit 1200.3.

Spare row decoder 112 further includes an NOR circuit 2020 for receiving signals SH0 to SH3 output from redundancy determining units 1200.0 to 1200.3 to output a signal NRE for instructing activation of the decoder operation for normal row decoder 110.

Redundancy determining unit 1200.0 includes a P-channel MOS transistor TP11 provided between a node n1 and a power-supply potential Vcc to be conducted in response to a signal /SRP for pre-charging node n11, and programming elements MR11 to MR18 provided in parallel between node n11 and ground potential GND.

Figure 11:
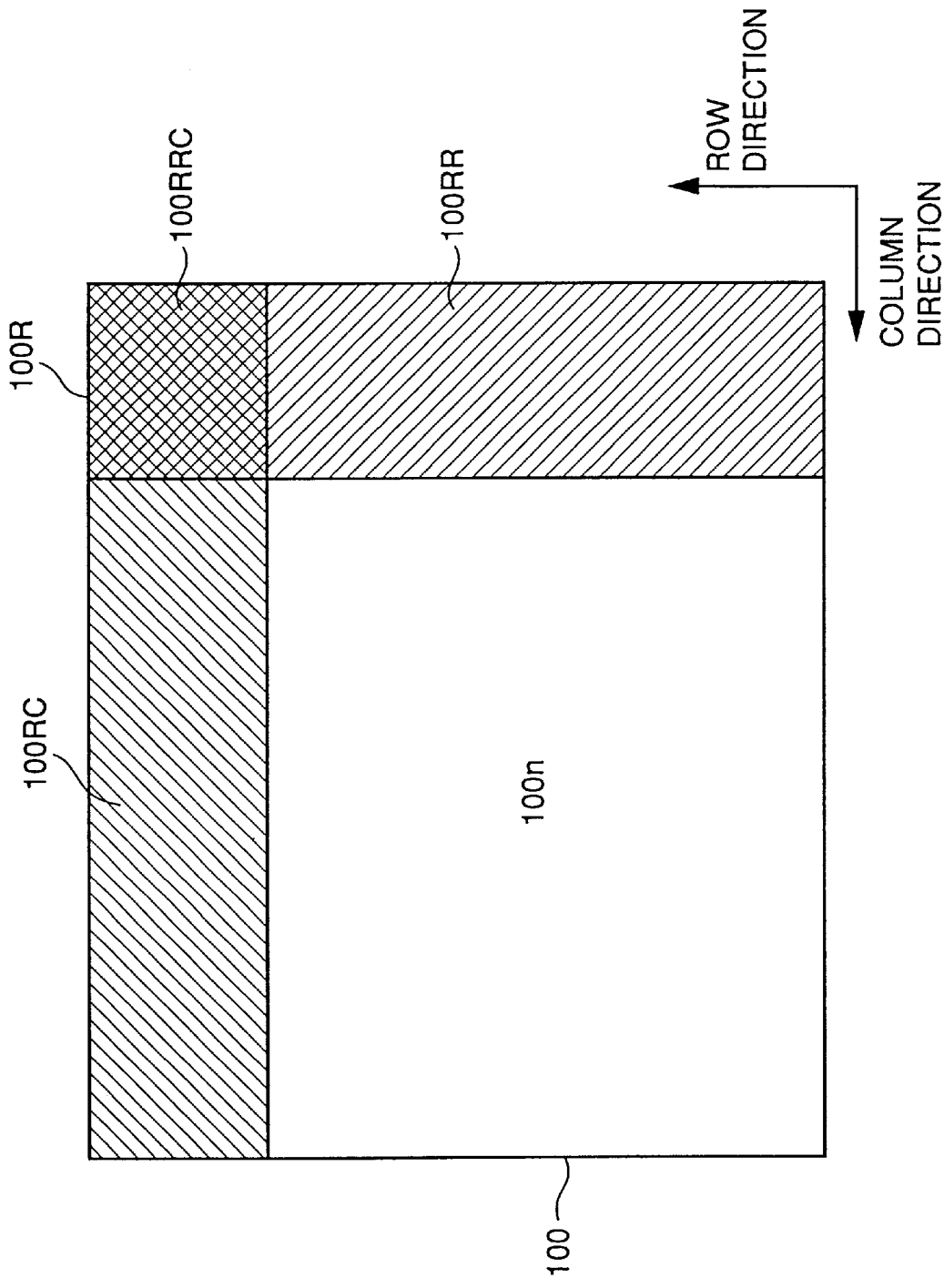
FIG. 11 schematically shows a configuration of a conventional memory cell array.
Figure 12:
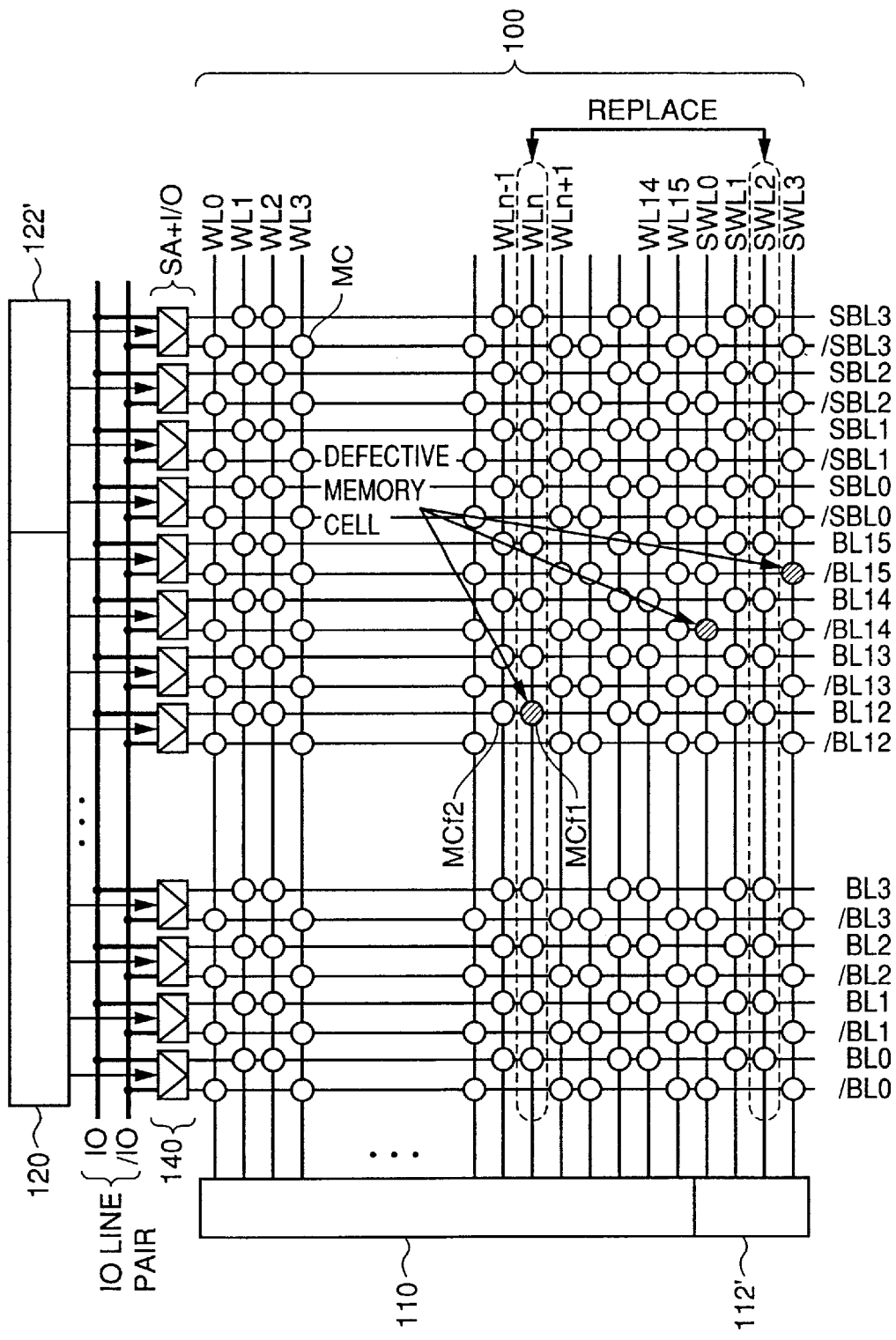
FIG. 12 is a schematic block diagram illustrating the configuration of memory cell array 100 in more detail.

Configurations of programming elements MR11 to MR18 are similar to the ones described with reference to FIG. 11, and thus the descriptions thereof will not be repeated.

Redundancy determining unit 1200.0 further includes a P-channel MOS transistor TP12 provided between node n11 and a power-supply potential Vcc, and an inverter INV11 provided between nodes n11 and n12. Node n11 and the gate of transistor TP12 are connected to each other, and thus transistor TP12 and inverter INV11 constitute a half latch circuit.

Redundancy determining unit 1200.0 further includes an inverter INV13 receiving a signal SR0 for inversion, a composite gate GCM11 for performing an NAND operation for a logical addition (OR) of an output of inverter INV13 and a signal /TM and a logical addition of a potential level of node n12 and signal TM to output a signal /SRD<0>, and a composite gate GCM12 performing an NAND operation for a logical addition of signal /RAr and signal /TM and a logical addition of a potential level of node n12 and signal TM to output a signal SH0.

A word line diiver circuit (not shown) diiving a word line SWL0 is controlled in response to signal /SRD<0>.

The other redundancy determining units 1200.1 to 1200.3 basically have similar configurations.

Figure 8:
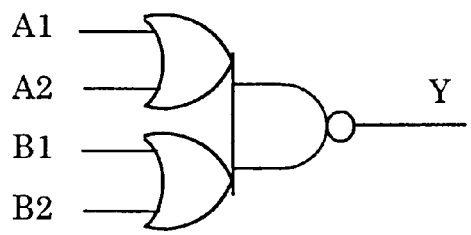
FIG. 8 is the first diagram illustrating a configuration of a composite gate GCM11 or GCM12.
Figure 9:
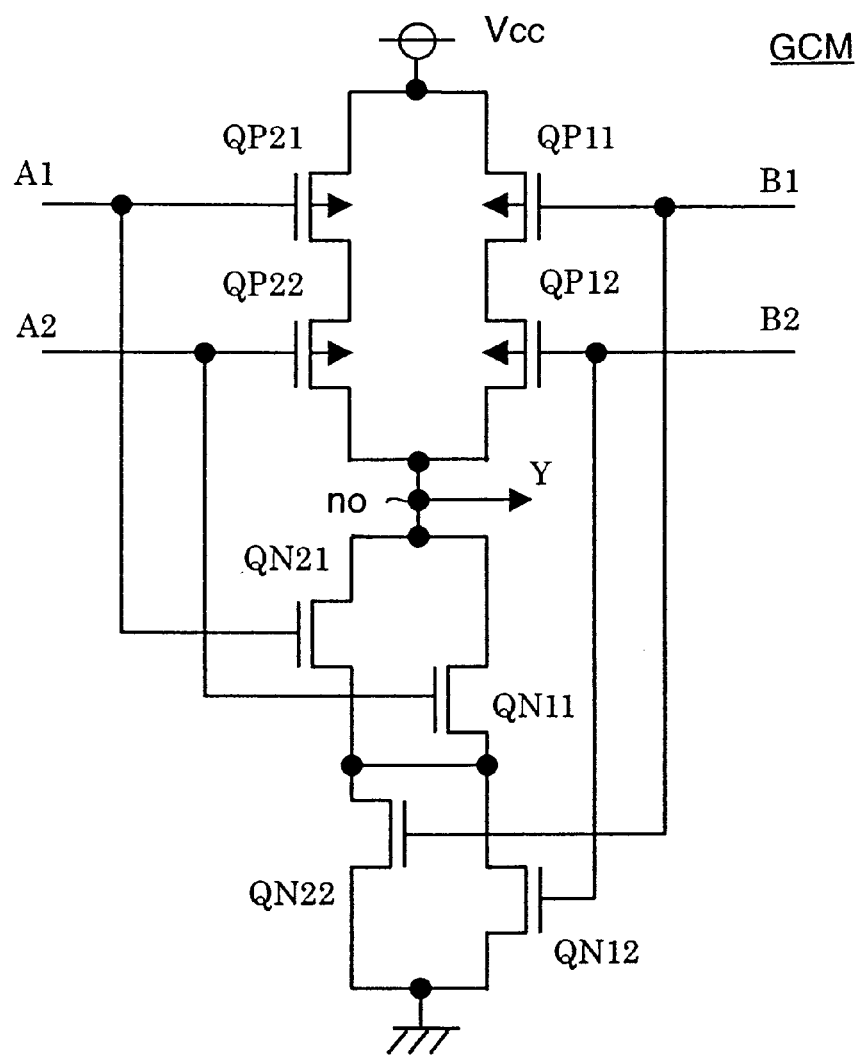
FIG. 9 is a second diagram illustrating a configuration of composite gate GCM11 or GCM12.

FIGS. 8 and 9 illustrate a configuration of composite gate GCM11 or GCM12 shown in FIG. 7. The configuration of composite gate GCM11 or GCM12 as well as configurations of the other composite gates GCM having configurations equal to the above will be described below for convenience. As shown in FIG. 8, composite gate GCM performs an NAND operation for a logical addition of signals A1 and A2 and signals B1 and B2 to output a signal Y.

Referring to FIG. 9, composite gate GCM includes P-channel MOS transistors QP11 and QP12 provided in series between a power-supply potential Vcc and an output node n0, P-channel MOS transistors QP21 and QP22 provided in series between power-supply potential Vcc and output node n0, N-channel MOS transistors QN11 and QN12 provided in series between output node n0 and a ground potential GND, and N-channel MOS transistors QN21 and QN22 provided in series between output node n0 and ground potential GND.

The drain of transistor QN12 and the drain of transistor QN22 are connected to each other.

Further, the gates of transistors QP21 and QN21 both receive a signal A1, the gates of transistors QP22 and QN11 both receive a signal A2, the gates of transistors QP11 and QP22 both receive a signal B1, and the gates of transistors QP12 and QN12 both receive a signal B2.

An operation of spare row decoder 112 shown in FIG. 7 is now briefly described.

The operation of spare row decoder 112 is basically the same as the operation of the spare row decoder 112" shown in FIG. 2.

i) Operation in Normal Operational Mode

If test signal TM is at "L" level whereas signal /TM is at "H" level when not in the test mode operation, redundancy determining circuits 1200.0 to 1200.3 determine whether a replacement should be made by spare word lines, as in the operation of spare row decoder 112" shown in FIG. 2.

ii) Operation in Test Operational Mode

On the other hand, in the test mode operation, if test mode signal TM is at "H" level whereas signal /TM is at "L" level, a spare word line can freely be selected from an external source in accordance with combinations of levels of row address signals RA<0>, RA<1>, /RA<0> and /RA<1> when signal RAr is set to "H" level. In such a case, signal /RAr is at "L" level, so that signal NRE is made to be at "L" level and thus selecting operation of the normal word line is inactivated.

When signal /RAr is set to "H" level in the test mode operation (test mode signal TM is at "H" level, signal /TM is at "L" level), a normal word line can be freely selected from an external source in accordance with combinations of row addresses RA<0>, RA<1> or the like (/RA<0:3>, RA<0:3>). In such a case, signal RAr is at "L" level, so that selecting operation of the redundant word line is inactivated.

This is described below in mode detail.

ii-1) Selecting Operation of Redundant Memory Cell Row in Test Operational Mode

For example, in the test operational mode, if internal row address signals /RA<0> and /RA<1> are both at "H" level, and the level of signal RAr is also at "H" level, then an output of inverter 1412.0 will be at "H" level. Signal TM is at "H" level, so that signal /SRD<0> from composite gate GCM11 will be at "H" level, independent of the level of node n12.

Further, when test mode signal TM is at "H" level, signal /TM is at "L" level, and signal /RAr is at "L" level, an output of composite gate GCM12 will be at "H" level whereas signal NRE will be at "L" level, and thus the selecting operation of the normal word line will be stopped.

ii-2) Selecting Operation of Normal Memory Cell Row in Test Operational Mode

When test mode signal TM is at "H" level and signal RAr is at "L" level, signals SR0 to SR3 will all be at "L", and thus an operation of spare word line selective signal generating circuit 1400 will be inactivated. Further, output signals /SRD<0> to /SRD<3> of composite gate GCM11 will be at "L" level, independent of the level of node n12.

Further, if signal TM is at "H" level and signal /RAr is also at "H" level, then the output level of composite gate GCM12 is at "L" level, independent of the potential level of node n12. That is, signal NRE will be at "H" level, independent of the potential level of node n12. Therefore, after the redundancy replacement, i.e., after the fuse is blown off, a memory cell of normal memory cell array portion 100n is selected in accordance with an address signal.

It is noted that spare column decoder 122 has a configuration similar to the above.

To summarize the above descriptions for FIGS. 2 and 7, with the configuration of redundancy determining circuit 112" shown in FIG. 2, in the test mode after the redundancy replacement, it is possible to selectively activate the redundant memory cell array portion alone, but impossible to selectively activate the normal memory cell array portion alone.

By contrast, with the above-described configuration of redundancy determining circuit 112 shown in FIG. 7, the normal memory cell array portion and the redundant memory cell array portion in the entire mounted memory cell space are equally treated in an access operation for the semiconductor memory device, such as read/write, allowing the normal memory cell array portion and the redundant memory cell array portion to be equivalently and successively accessed.

Therefore, a boundary portion where the normal memory cell array portion and the redundant memory cell array portion in the memory cell space are adjacent to each other can also be subjected to the acceleration test.

Although the above description has been made to an example where an output signal input terminal receiving output enable signal OE is used, configurations using other control signal input terminals may also be possible.

Second Embodiment

In the first embodiment, the configuration in which one of control signal input terminal group 6, for example, an output enable signal input terminal, is used for generating signals RAr, CAr and so forth was described. In the second embodiment, however, a configuration in which signals RAr, CAr and so forth are generated based on signals from the other terminals will be described.

Figure 10:
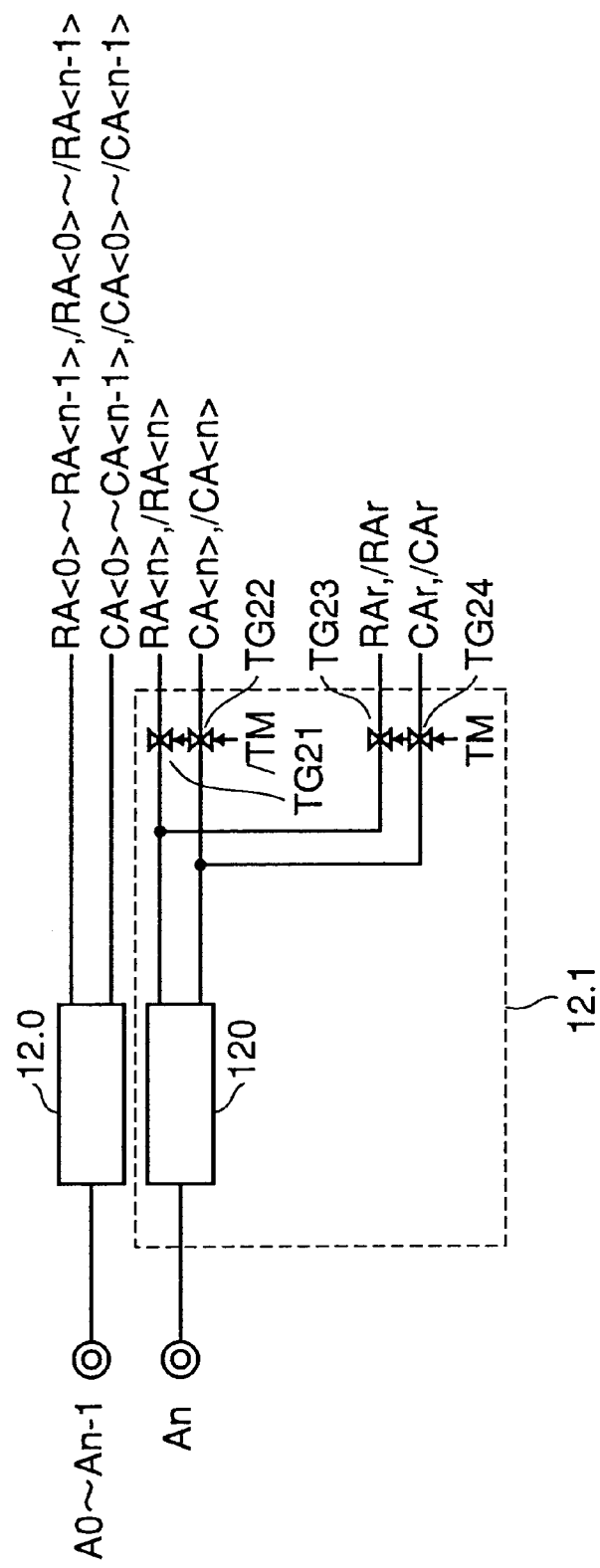
FIG. 10 is a schematic block diagram illustrating a configuration of address buffer 12 according to the second embodiment of the present invention.

FIG. 10 is a schematic block diagram illustrating a configuration of an address buffer 12 according to the second embodiment of the present invention.

Address buffer 12 includes an address buffer 12.0 for receiving address signals A0 to An−1 to output internal address signals RA<0> to RA<n−1> and /RA<0> to /RA<n−1>, and an address buffer 12.1 for receiving an address signal An to generate internal address signals RA<n>, /RA<n>, CA<n> and /CA<n> in the normal operational mode, and to output a redundant row address control signal RAr and redundant column address control signal CAr in the test operational mode.

Address buffer 12.1 includes a buffer circuit 120 for receiving address signal An for buffering, transfer gates TG21 and TG22 controlled by signal /TM for outputting an output from buffer circuit 120 as signals RA<n>, /RA<n>, CA<n> and /CA<n> in the normal mode, and transfer gates TG23 and TG24 controlled by signal TM to output an output of buffer circuit 120 as signals RAr, /RAr, CAr and /CAr in the test operational mode.

In a semiconductor memory device, its word configuration and refresh cycle are often fixedly set by wire bonding at the time of assembly. Some word configuration or refresh cycle may render address input pins or data input/output pins unused.

For example, a 64 Mb DRAM has two types of refresh modes, i.e., 4K refresh cycle mode and 8K refresh cycle mode.

In this case, the word configuration is generally ×4,×8 or ×16 when it is set more than ×2.

When operated in ×4, 8K refresh cycle mode, as an example of the word configuration being more than ×2, address signals A0 to A12 are applied to address input terminals in order to generate internal addresses of address signals RA<0> to RA<12> and CA<0> to CA<10>.

When the same semiconductor chip is used in ×4, 4K refresh cycle operational mode, RA<0> to RA<1> and CA<0> to CA<11> will be required for internal addresses, and address signals A0 to A11 will be applied to address input terminals. Therefore, in such a case, an address pin A12 remains unused.

An address signal shown in FIG. 10 thus corresponds to the address input pin that has remained unused, so that an effect similar to that of the first embodiment can advantageously be attained without increase of the number of input pins.

Therefore, the normal memory cell array portion and the redundant memory cell array portion in the memory cell space can be distinguished from each other to enable an arbitrary selection of a memory cell from an external source, so that malfunctions of the entire memory cell space including the redundant memory cell portion can be subjected to the acceleration test, independent of replacement of a defective memory cell by the redundant memory cell. Thus, testing of the defective memory cell can easily be implemented with high power of detection.

It is noted that an unused data input/output pin may be used instead of an unused address input pin.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a memory cell array having memory cells arranged in a plurality of rows and columns;

said memory cell array including a normal memory cell array in which a plurality of normal memory cells are arranged, and a redundant memory cell array in which a plurality of redundant memory cells are arranged for replacing said plurality of normal memory cells;

an operational mode detecting circuit detecting that a predetermined operational mode is designated in accordance with an external instruction;

an address signal input terminal group receiving an address signal for selecting said memory cell; and a memory cell selecting circuit capable of selecting said normal memory cells and said redundant memory cells independently and successively in response to said address signal in said predetermined operational mode.

2. The semiconductor memory device according to claim 1, wherein said memory cell selecting circuit includes a normal cell selecting circuit selecting said normal memory cell in response to said address signal, and a redundant cell selecting circuit pre-storing a defective memory cell address in said normal memory cell array to select said redundant memory cell instead of said normal memory cell in a normal operational mode, and wherein said redundant cell selecting circuit includes a selective signal generating circuit selecting a designated redundant memory cell in response to said address signal, when an redundancy selecting operation is designated in said predetermined operational mode, and a replacement halt circuit stopping a replacement operation for said normal memory cell and said redundant memory cell, when said redundancy selecting operation is undesignated in said predetermined operational mode.

3. The semiconductor memory device according to claim 2, further comprising:

a control signal input terminal receiving an external instruction of redundancy selecting operation in said predetermined operational mode; and a control signal input circuit generating a redundancy selecting control signal for instructing said redundancy selecting operation based on a signal from said control signal input terminal.

4. The semiconductor memory device according to claim 3, wherein said control signal input terminal receives a signal for controlling a normal operation of said semiconductor memory device in said normal operational mode.

5. The semiconductor memory device according to claim 4, wherein said signal for controlling the normal operation is an output enable signal.

6. The semiconductor memory device according to claim 3, wherein said control signal input terminal is an unused address signal input terminal of said address signal input terminal group.

7. The semiconductor memory device according to claim 1, wherein said memory cell selecting circuit includes
- a normal cell selecting circuit selecting said normal memory cell in response to said address signal, and
- a redundant cell selecting circuit selecting said redundant memory cell, and wherein
  - said redundant cell selecting circuit includes a defective address determining circuit pre-stoling a defective memory cell address in said normal memory cell address for comparison with said address signal,
  - a redundant address selecting circuit instructing selection of a designated redundant memory cell in response to said address signal, when a redundancy selecting operation is designated in said predetermined operation mode, and
  - a redundancy selection instructing circuit selecting said redundant memory cell instead of said normal memory cell in response to a determination result of said defective address determining circuit in a normal operational mode, and selecting said redundant memory cell in response to activation of said redundancy selecting operation and an instruction of said redundant address selecting circuit and stopping a replacement operation of said normal memory cell and said redundant memory cell in response to inactivation of said redundancy selecting operation in said predetermined operational mode.

8. The semiconductor memory device according to claim 7, wherein a redundancy identification address is allocated to said memory cell array for discriminating said normal memory cell array from said redundant memory cell array, and an activation of said redundancy selecting operation is designated by a redundancy identification address signal corresponding to said redundancy identification address.

9. The semiconductor memory device according to claim 8, further comprising:

a control signal input terminal receiving an external instruction of a redundancy selecting operation in said predetermined operational mode; and a control signal input circuit generating said redundancy identification address signal based on a signal from said control signal input terminal.

10. The semiconductor memory device according to claim 9, wherein said control signal input terminal receives a signal for controlling a normal operation of said semiconductor memory device in said normal operational mode.

11. The semiconductor memory device according to claim 10, wherein said signal for controlling the normal operation is an output enable signal.

12. The semiconductor memory device according to claim 9, wherein said control signal input terminal is an unused address signal input terminal of said address signal input terminal group.

\* \* \* \* \*